(12) United States Patent
Tang et al.

(10) Patent No.: US 11,901,271 B2
(45) Date of Patent: Feb. 13, 2024

(54) HIGH CURRENT PACKAGES WITH REDUCED SOLDER LAYER COUNT

(71) Applicant: TEXAS INSTRUMENTS INCORPORATED, Dallas, TX (US)

(72) Inventors: Yiqi Tang, Allen, TX (US); Liang Wan, Chengdu (CN); William Todd Harrison, Apex, NC (US); Manu Joseph Prakuzhy, Allen, TX (US); Rajen Manicon Murugan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/148,627

(22) Filed: Dec. 30, 2022

(65) Prior Publication Data
US 2023/0145761 A1 May 11, 2023

Related U.S. Application Data

(63) Continuation of application No. 16/787,327, filed on Feb. 11, 2020, now Pat. No. 11,545,420.
(Continued)

(51) Int. Cl.
*H01L 23/495* (2006.01)
*H02M 3/158* (2006.01)
*H01L 23/00* (2006.01)

(52) U.S. Cl.
CPC .. *H01L 23/49575* (2013.01); *H01L 23/49524* (2013.01); *H01L 23/49562* (2013.01);
(Continued)

(58) Field of Classification Search
CPC ......... H01L 23/49575; H01L 23/49562; H01L 23/49524; H01L 24/32; H01L 2224/32245; H02M 3/158; E21B 44/00; E21B 47/00; E21B 41/0092; E21B 44/005; E21B 44/04; E21B 47/0006; E21B 21/08; E21B 3/00; E21B 44/02; E21B 45/00; E21B 47/04; E21B 47/06; E21B 47/10; E21B 7/068; E21B 7/24; E21B 10/08; E21B 10/18; E21B 19/08; E21B 2049/085; E21B 21/00;
(Continued)

(56) References Cited

U.S. PATENT DOCUMENTS

2006/0113664 A1* 6/2006 Shiraishi ........... H01L 23/49551
257/E23.047
2014/0061884 A1* 3/2014 Carpenter ............... H01L 24/73
257/676
(Continued)

*Primary Examiner* — Robert G Bachner
(74) *Attorney, Agent, or Firm* — Yudong Kim; Frank D. Cimino

(57) ABSTRACT

In some examples, a direct current (DC)-DC power converter package comprises a controller, a conductive member, and a first field effect transistor (FET) coupled to the controller and having a first source and a first drain, the first FET coupled to a first portion of the conductive member. The package also comprises a second FET coupled to the controller and having a second source and a second drain, the second FET coupled to a second portion of the conductive member, the first and second portions of the conductive member being non-overlapping in a horizontal plane. The first and second FETs are non-overlapping.

27 Claims, 15 Drawing Sheets

Related U.S. Application Data

(60) Provisional application No. 62/804,495, filed on Feb. 12, 2019.

(52) U.S. Cl.
CPC ............ *H01L 24/32* (2013.01); *H02M 3/158* (2013.01); *H01L 2224/32245* (2013.01)

(58) Field of Classification Search
CPC ........ E21B 21/06; E21B 31/005; E21B 41/00; E21B 41/0085; E21B 43/126; E21B 43/128; E21B 47/0007; E21B 47/101; E21B 47/12; E21B 47/122; E21B 47/16; E21B 47/18; E21B 49/003; E21B 49/08; E21B 4/20; E21B 6/00; E21B 7/06; E21B 7/10; E21B 7/28; G05B 15/02; G05B 19/02; G05B 13/048; G05B 2219/24075; G05B 2219/2616; G05B 23/0243; G05B 13/042; G05B 19/05; G05B 2219/13095; G05B 13/041; G05B 19/402; G05B 2219/45129

See application file for complete search history.

(56) References Cited

U.S. PATENT DOCUMENTS

| | | | |
|---|---|---|---|
| 2015/0059362 A1* | 3/2015 | Chou | F25B 21/02 62/3.7 |
| 2016/0284629 A1* | 9/2016 | Shea | H01L 23/4951 |

* cited by examiner

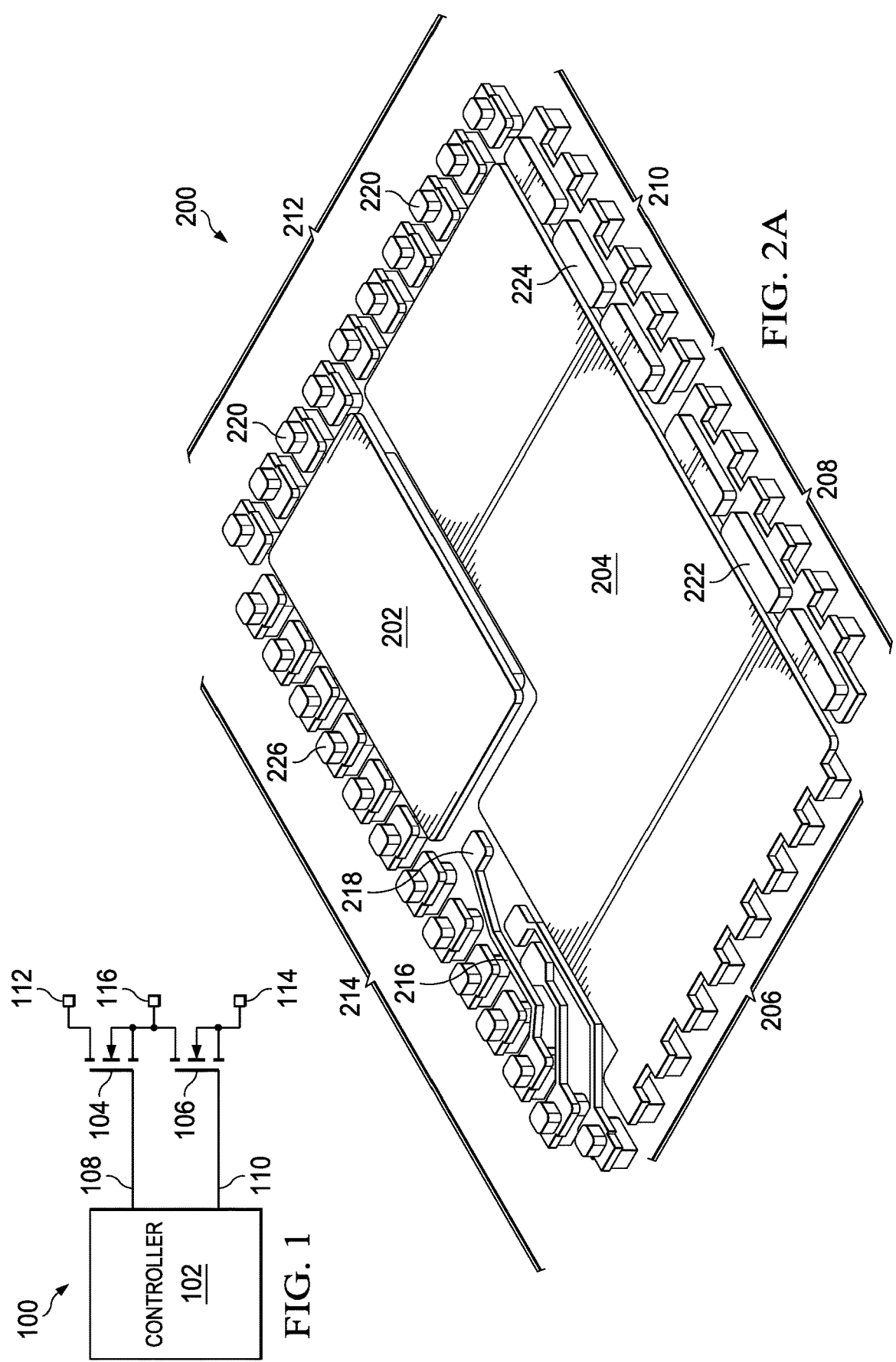

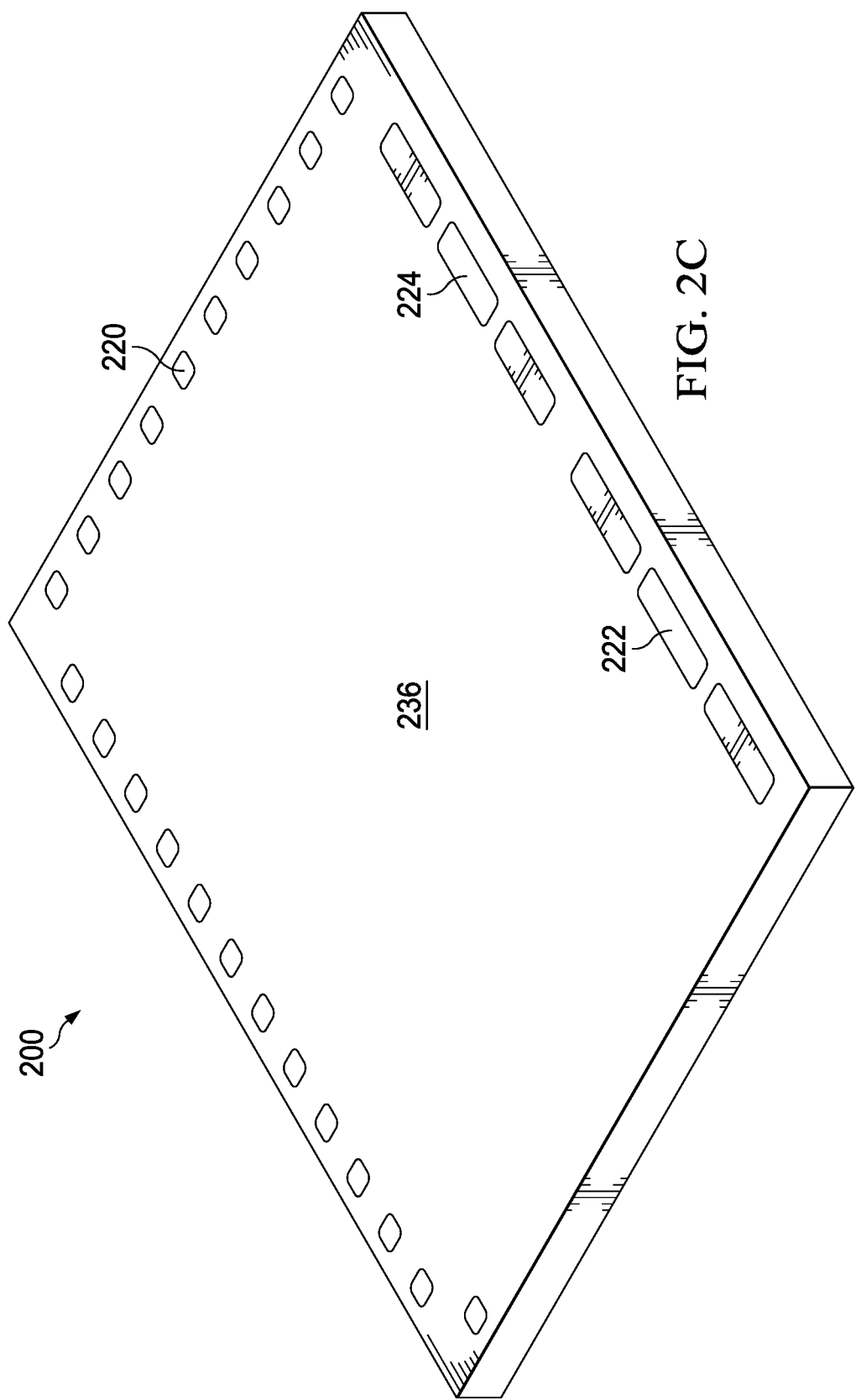

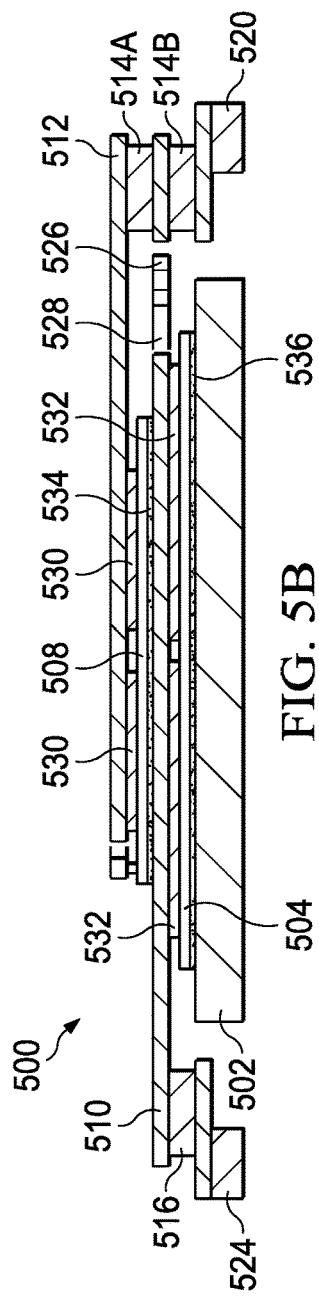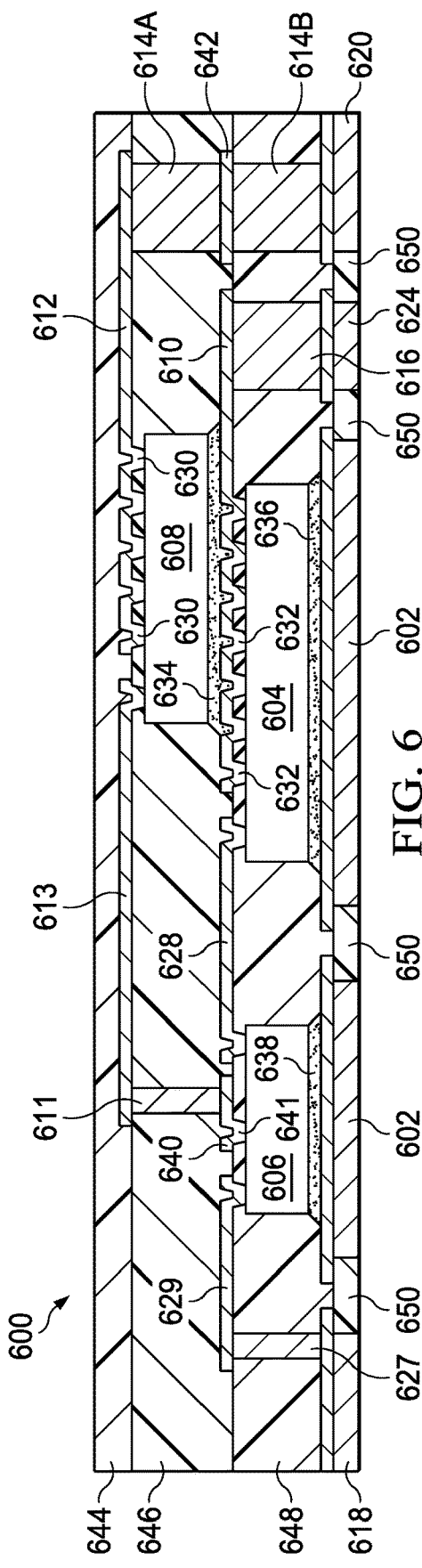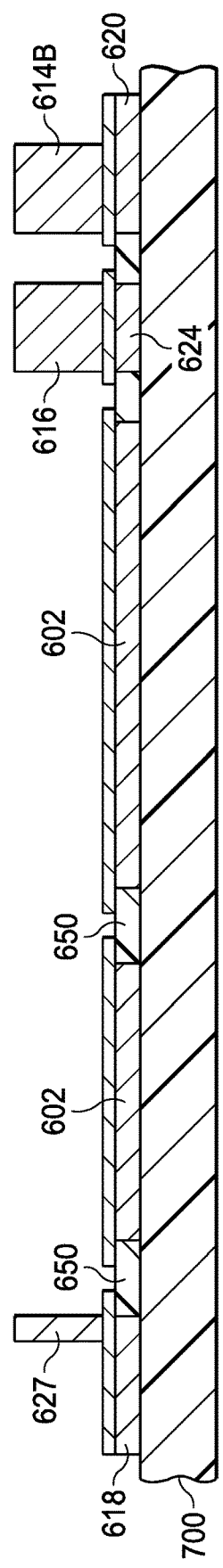

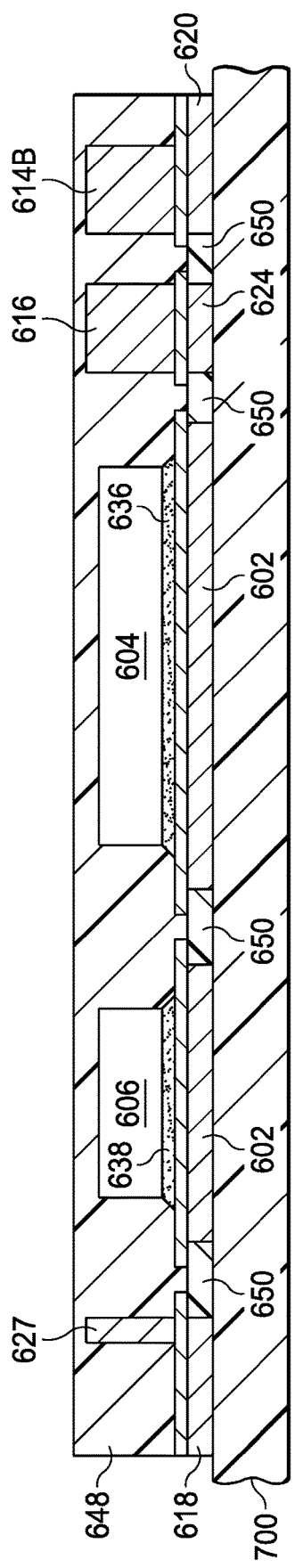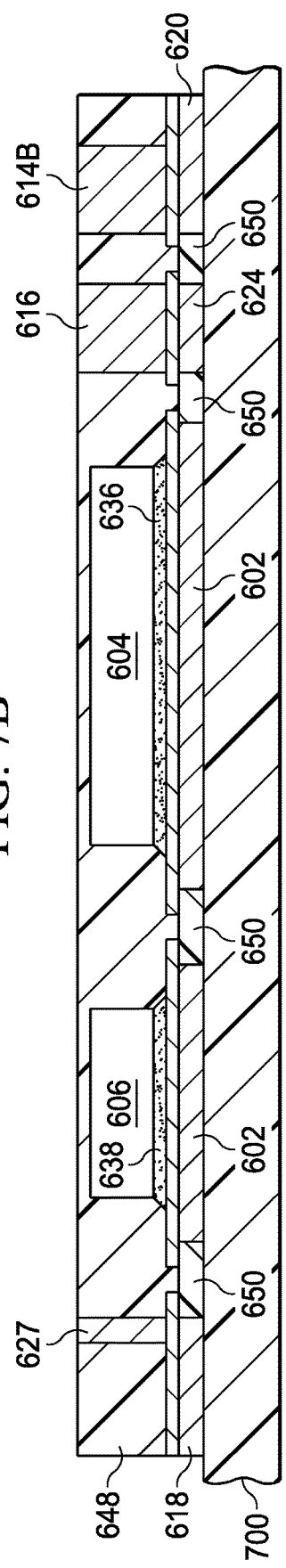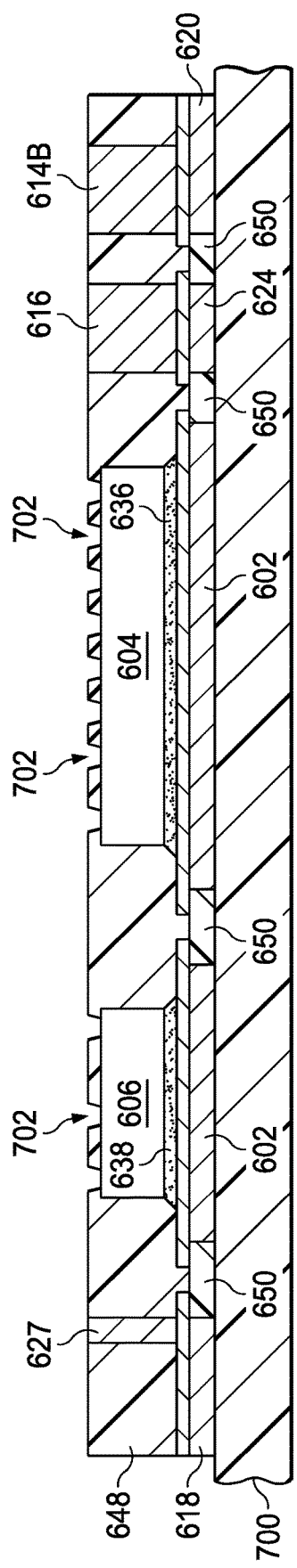
FIG. 7B
FIG. 7C
FIG. 7D

HIGH CURRENT PACKAGES WITH REDUCED SOLDER LAYER COUNT

CROSS-REFERENCE TO RELATED APPLICATIONS

The present application is a continuation of U.S. patent application Ser. No. 16/787,327, entitled "HIGH CURRENT PACKAGES WITH REDUCED SOLDER LAYER COUNT," filed Feb. 11, 2020, which claims the benefit of U.S. Provisional Patent Application No. 62/804,495, entitled "SEMICONDUCTOR DEVICE WITH SIDE-BY-SIDE PACKAGING SOLUTION," filed Feb. 12, 2019, and the entirety of both of which are hereby incorporated herein by reference.

BACKGROUND

During manufacture, semiconductor chips (also commonly referred to as "dies") are typically mounted on die pads of lead frames and are wire-bonded, clipped, or otherwise coupled to leads of the lead frame. Other devices may similarly be mounted on a lead frame pad. The assembly is later covered in a mold compound, such as epoxy, to protect the assembly from potentially damaging heat, physical trauma, moisture, and other deleterious factors. The finished assembly is called a semiconductor package or, more simply, a package. The leads are exposed to surfaces of the package and are used to electrically couple the packaged chip to devices outside of the package.

SUMMARY

In some examples, a direct current (DC)-DC power converter package comprises a controller, a conductive member, and a first field effect transistor (FET) coupled to the controller and having a first source and a first drain, the first FET coupled to a first portion of the conductive member. The package also comprises a second FET coupled to the controller and having a second source and a second drain, the second FET coupled to a second portion of the conductive member, the first and second portions of the conductive member being non-overlapping in a horizontal plane. The first and second FETs are non-overlapping.

BRIEF DESCRIPTION OF THE DRAWINGS

For a detailed description of various examples, reference will now be made to the accompanying drawings in which:

FIG. 1 depicts a schematic circuit diagram of a semiconductor device using a side-by-side die configuration, in accordance with various examples.

FIGS. 2A-2G depict a process flow for manufacturing a semiconductor device using a side-by-side die configuration, in accordance with various examples.

FIGS. 5A and 5B depict perspective and cross-sectional views, respectively, of a semiconductor device using a stacked die configuration, in accordance with various examples.

FIG. 6 depicts a cross-sectional view of a semiconductor device using a stacked die configuration, in accordance with various examples.

FIGS. 7A-7H depict a process flow for manufacturing a semiconductor device using a stacked die configuration, in accordance with various examples.

DETAILED DESCRIPTION

Figure 2B:
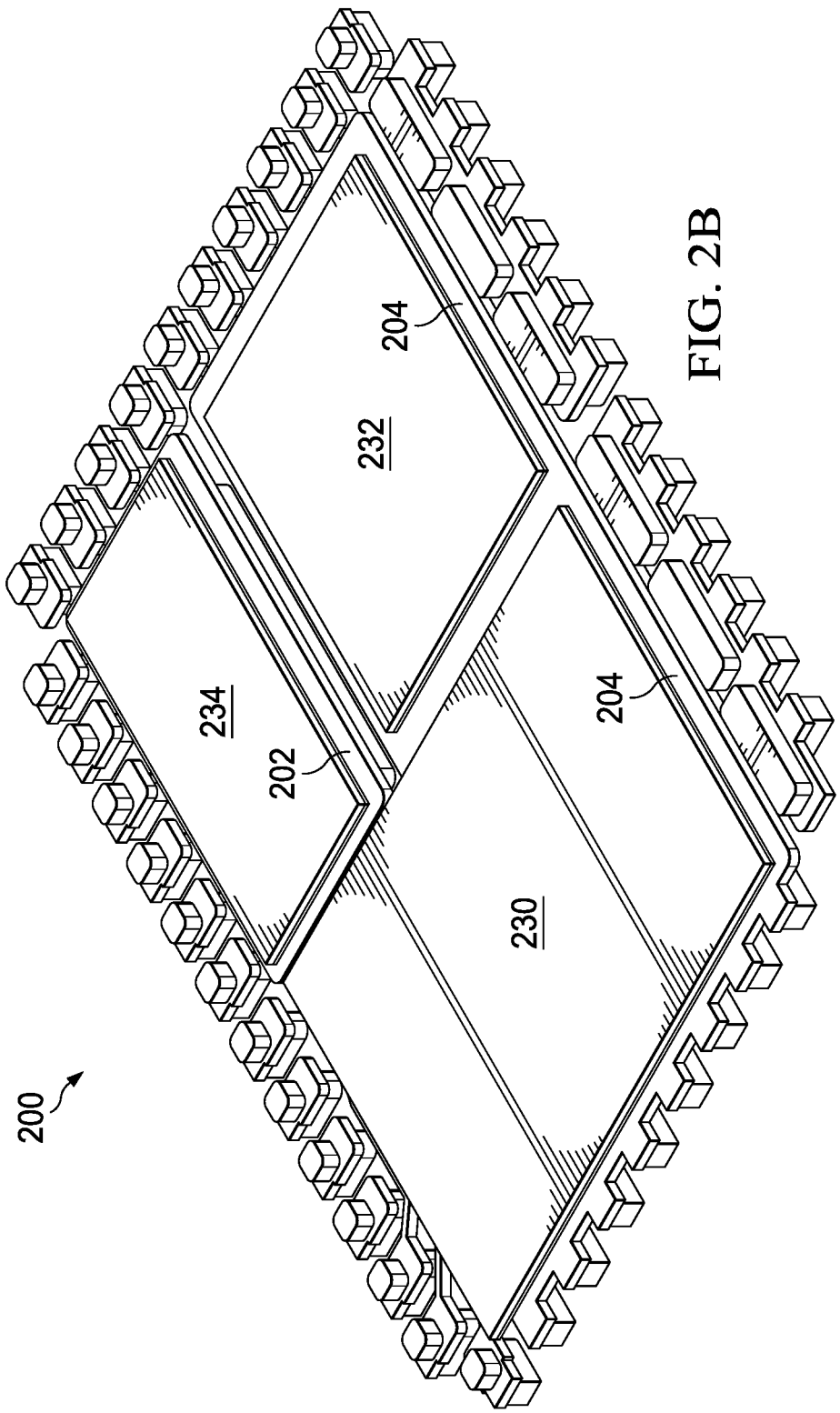

Some packages contain multiple dies. For example, a high-current power device may include multiple transistor dies, such as high-side and low-side field effect transistors (FETs). A high-side FET is a FET that pulls up a node coupled to both the high-side and low-side FETs when the high-side FET is on and the low-side FET is off. Conversely, a low-side FET is a FET that pulls that node down when the low-side FET is on and the high-side FET is off. To enable the high-side FET to pull the node high, the high-side FET couples to a power source, such as a voltage supply rail, and to enable the low-side FET to pull the node low, the low-side FET couples to ground. In addition, such high-current power devices may include a controller die and other dies. To conserve space, such dies are sometimes arranged in a stacked configuration. The various components in the stack, including the dies, may be coupled to each other using multiple layers of solder. An increased number of components (e.g., dies) in the stack results in an increased number of solder layers in the stack, so that the components can electrically couple to and communicate with each other. In high current devices, such as power devices, the current density is increased in these solder layers, particularly when the solder layers have a small surface area. High current densities can damage the solder layers, thereby damaging the device and, in certain cases, rendering the device inoperable.

This disclosure describes various examples of semiconductor devices in which multiple dies are positioned in a side-by-side configuration rather than a traditional stacked configuration. By positioning the dies side-by-side and avoiding the use of traditional stacked dies, the number of solder layers vulnerable to high current densities and mechanical stress is reduced. For example, clips are commonly used in stacked die configurations, and these clips are coupled to conductive terminals (e.g., leads) of the package in which they are housed using small solder joints. These solder joints are vulnerable to cracking and other types of mechanical damage, particularly when subjected to high levels of current. Thus, when a side-by-side die configuration is used as described herein, specific advantages to the mechanical integrity of the package are realized due to the reduced number of solder layers (e.g., reduced cracking). Similarly, when a side-by-side die configuration is used as described herein, specific functional advantages are also realized due to the reduced number of solder layers (e.g., extended package life due to reduced cracking, improved package operation due to proper current flow). Thus, the aforementioned problem, which arises from the presence of many solder layers (particularly solder layers with low surface areas), is mitigated.

The scope of this disclosure is not limited to arranging dies in a side-by-side configuration. Rather, any component in a semiconductor package that uses solder layers to couple to other component(s) may be positioned in a side-by-side configuration to reduce the number of solder layers, particularly low-surface-area solder layers, used in the semiconductor device. In addition, the techniques described herein may be used in any suitable type of package, without limitation. For example, the techniques may find application in molded interconnect substrate (MIS) quad flat no leads (QFN) packages, among others.

Furthermore, this disclosure describes various examples of semiconductor devices in which multiple dies are positioned in a novel stacked configuration in a manner such that the number of solder layers used is minimized (e.g., two solder layers are used instead of six solder layers, as may be the case in traditional stacked die configurations). This novel stacked configuration with a low solder layer count may be implemented using plated pillars, which do not involve the use of solder layers, instead of clips, which may use solder layers to achieve adhesion between the clip and a lead or other conductive component. Such a stacked configuration may find application in MIS packages, among others.

FIGS. 1, 2A-2G, 3A-3B, and 4A-4B and the corresponding text below depict and describe the side-by-side configuration mentioned above, while FIGS. 5A-5B, 6, and 7A-7H and the corresponding text below depict and describe the novel stacked configuration mentioned above. These examples result in a low solder layer count (e.g., two solder layers). Furthermore, in examples, the solder layers that are present have a surface area sufficiently large so as to mitigate the degradation of the solder layers through, e.g., high current throughput. Similarly, the plated and pillared structures described herein may improve the electrical and/or thermal performance of packaged devices due to their widths and thicknesses.

FIG. 1 depicts a schematic circuit diagram of a semiconductor device 100, in accordance with various examples. The device 100 may be, for example, a power device, such as a portion of a direct current (DC)-DC power converter (e.g., a switch mode power supply (SMPS)). As explained above, the device 100 may be any kind of packaged semiconductor device in which components that would ordinarily be soldered together in a stacked configuration are instead configured in a side-by-side configuration. In other examples, the device 100 may be any kind of packaged semiconductor device implementing the novel stacked configuration described herein. The remainder of this disclosure describes implementation of the novel damage-mitigation techniques in the context of the device 100, but, as explained, the principles and techniques described herein with respect to the device 100 may be extended to apply to any of a variety of semiconductor devices.

The device 100 comprises a controller 102 that couples to a high-side FET 104 and a low-side FET 106. A connection 108 couples the controller 102 to a gate of the high-side FET 104, and a connection 110 couples the controller 102 to a gate of the low-side FET 106. A drain of the high-side FET 104 couples to a power supply connection 112, and a source of the high-side FET 104 couples to a switching node (output node) 116, for example of an SMPS. A source of the low-side FET 106 couples to a ground connection 114, and a drain of the low-side FET 106 couples to the switching node 116. The scope of this disclosure is not limited to the specific FET configuration shown in FIG. 1.

In operation, the controller 102 controls the gates of the FETs 104, 106, thereby controlling the switching action of the FETs 104, 106. Generally, when the controller 102 controls the high-side FET 104 to be on, the controller 102 controls the low-side FET 106 to be off. Conversely, in general, when the controller 102 controls the low-side FET 106 to be on, the controller 102 controls the high-side FET 104 to be off. When the high-side FET 104 is on, the switching node 116 is pulled up by the power supply connection 112. Conversely, when the low-side FET 106 is on, the switching node 116 is pulled downward by the ground connection 114. As the remaining drawings and the description below explains, the controller 102 and the FETs 104, 106 may be incorporated into a semiconductor package in a side-by-side configuration rather than a stacked configuration, thereby minimizing the number of solder layers used and thus mitigating likelihood of solder degradation and failure.

FIGS. 2A-2G depict a process flow for manufacturing a semiconductor device, in accordance with various examples. In particular, FIGS. 2A-2G depict various stages of the manufacturing process for a semiconductor device 200. FIG. 2A depicts a lead frame having a controller pad 202 and a conductive member 204. The perimeter of the lead frame includes a plurality of conductive terminals 206, 208, 210, 212, and 214. The conductive terminals 206 may be formed as part of the conductive member 204. In some examples, the conductive terminals 208, 210 are formed separate from the conductive member 204 and the controller pad 202. In some examples, the conductive terminals 212 are formed separate from the conductive member 204 and from the controller pad 202. In some examples, the conductive terminals 214 are formed separate from the conductive member 204 and the controller pad 202. In some examples, each of the conductive terminals 214 has a pillar 226 formed thereupon. A pillar 226 comprises, for instance, a copper protrusion formed using, e.g., a suitable photolithography process. Pillars 220 are analogous to the pillars 226. In some examples, multiple of the conductive terminals 208 include pillars 222, and multiple of the conductive terminals 210 include pillars 224. Pillars 222 and 224 may be similar in material and fabrication to the pillars 226, although the pillars 222, 224, and 226 may differ in size. The lead frame also may include traces 216 coupled to some of the conductive terminals 206 and/or 214 and to bond pads 218. As described below, the bond pads 218, the traces 216, and their respective conductive terminals 206, 214 may be used to route signals to and from bond pads on the bottom surface of a die or other electrical device mounted on the conductive member 204.

FIG. 2B depicts the example of FIG. 2A, but with electronic devices mounted to the controller pad 202 and the conductive member 204. In particular, FIG. 2B depicts a controller 234 (such as the controller 102 of FIG. 1) mounted to the controller pad 202, a low-side FET 230 mounted to a first portion of a lengthwise surface of the conductive member 204, and a high-side FET 232 mounted to a second portion of the lengthwise surface of the conductive member 204 that is different than (does not overlap with) the first portion of the conductive member 204. In some examples, the first and second portions may be in the same horizontal plane. In some examples, the FETs 230, 232 may be in the same horizontal plane. Electronic devices other than FETs and controllers may be mounted on the pad 202 and the conductive member 204.

FIG. 2C depicts the example of FIG. 2B, but with molding 236 (e.g., epoxy) encapsulating the structure of FIG. 2B. The molding 236 is ground to expose portions of the structure of FIG. 2B. For example, the molding 236 is ground to expose the pillars 220, 222, and 224, as shown in FIG. 2C. In some examples, fewer than all pillars 220, 222, and 224 are exposed, although in other examples, all pillars 220, 222, and 224 are exposed.

Figure 2D:
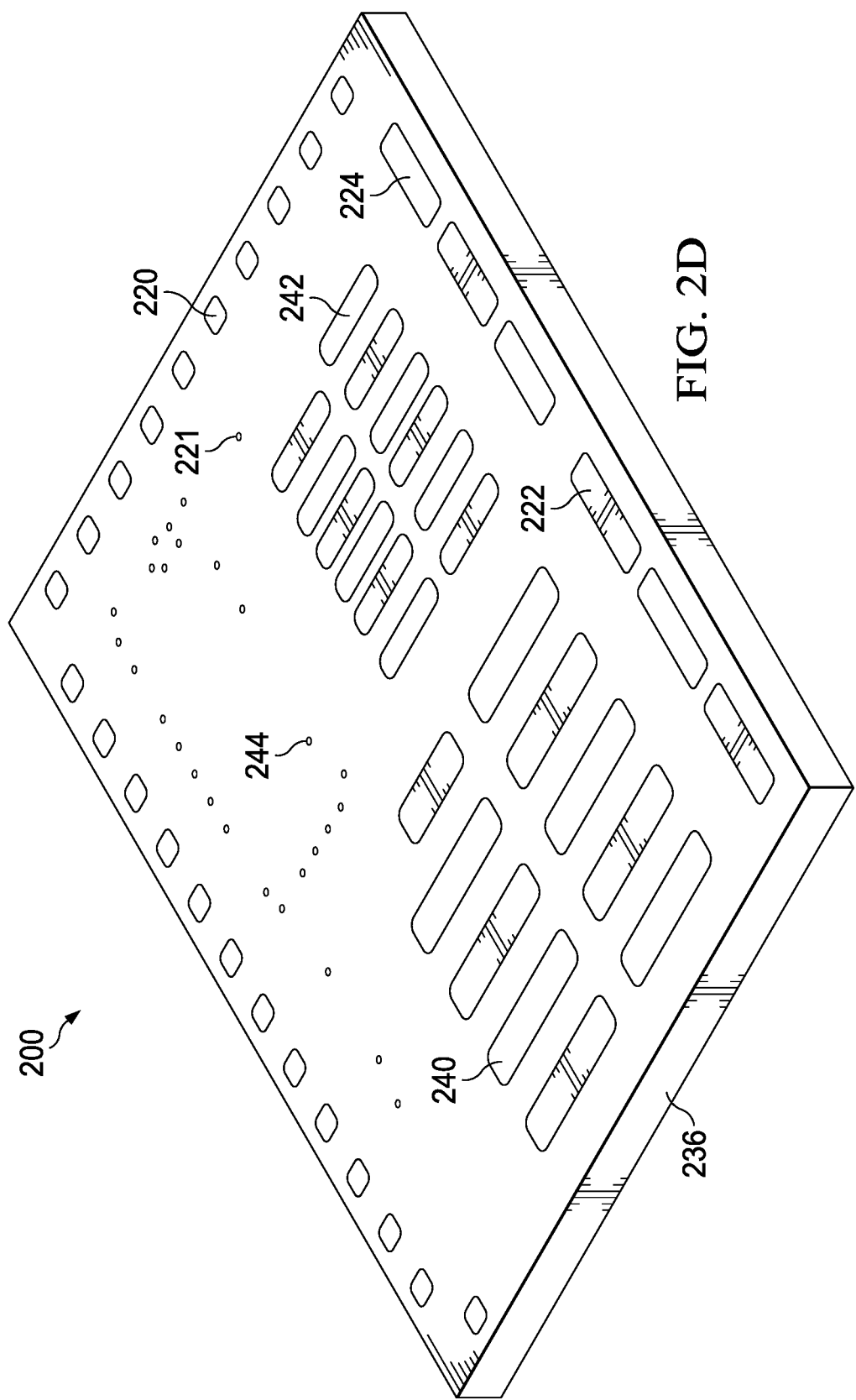

FIG. 2D depicts the example of FIG. 2C, but with a drilling process (e.g., a laser drilling process) having been performed in the molding 236 to expose various bond pads that may be present on the FETs 230, 232 and the controller 234. (The bond pads are not expressly depicted in FIG. 2B to preserve clarity and simplicity.) For example, FIG. 2D depicts bond pads 244 on the controller 234 exposed, bond pad 221 and bond pads 242 on the high-side FET 232 exposed, and bond pads 240 on the low-side FET 230 exposed. Alternative techniques may be used in lieu of drilling, for example, chemical wet etch, plasma etching, etc. In addition, any suitable number of bond pads may be exposed, with the bond pads depicted in FIG. 2D being merely representative. In some examples, conductive pillars may be formed on the bond pads, and a subsequent grinding process may expose the top surfaces of the conductive pillars, thereby making the conductive pillars accessible for coupling instead of the bond pads.

In some examples, the bond pads 221, 240, and 242 provide electrical access to FET terminals. For example, bond pad 221 may couple to a gate terminal of the high-side FET 232. For example, bond pads 242 may couple to a source or a drain of the high-side FET 232. For example, bond pads 240 may couple to a source or a drain of the low-side FET 230. In some examples, the source of the high-side FET 232 faces upward while the drain of the low-side FET 230 faces upward (in which case the drain of the high-side FET 232 faces downward and the source of the low-side FET 230 faces downward). In some examples, the drain of the high-side FET 232 faces upward while the source of the low-side FET 230 faces upward (in which case the source of the high-side FET 232 faces downward while the drain of the low-side FET 230 faces downward). In some examples, the drains of both FETs 230, 232 face upward (in which case the sources of both FETs 230, 232 face downward). In some examples, the sources of both FETs 230, 232 face upward (in which case the drains of both FETs 230, 232 face downward). Regardless of the configuration of sources and drains, the gates of the FETs 230, 232 may face upward or downward in any suitable combination. In the example of FIG. 2D, the gate of the high-side FET 232 faces upward and is thus accessible via the bond pad 221, while the gate of the low-side FET 230 faces downward and is thus accessible via the traces 216, bond pads 218, and respective conductive terminals 206/214. (In general, when two or more components face upward, they are said to be facing a common direction, and when they face downward, they are said to be facing a common direction. When one component faces one direction and another component faces a different direction, the two components are said to be facing in opposite directions.) The bond pads 244 provide access to various nodes of the controller 234. Thus, for example, some of the bond pads 244 may be coupled to the gates of the FETs 230, 232 to control the FETs 230, 232.

Figure 2E:
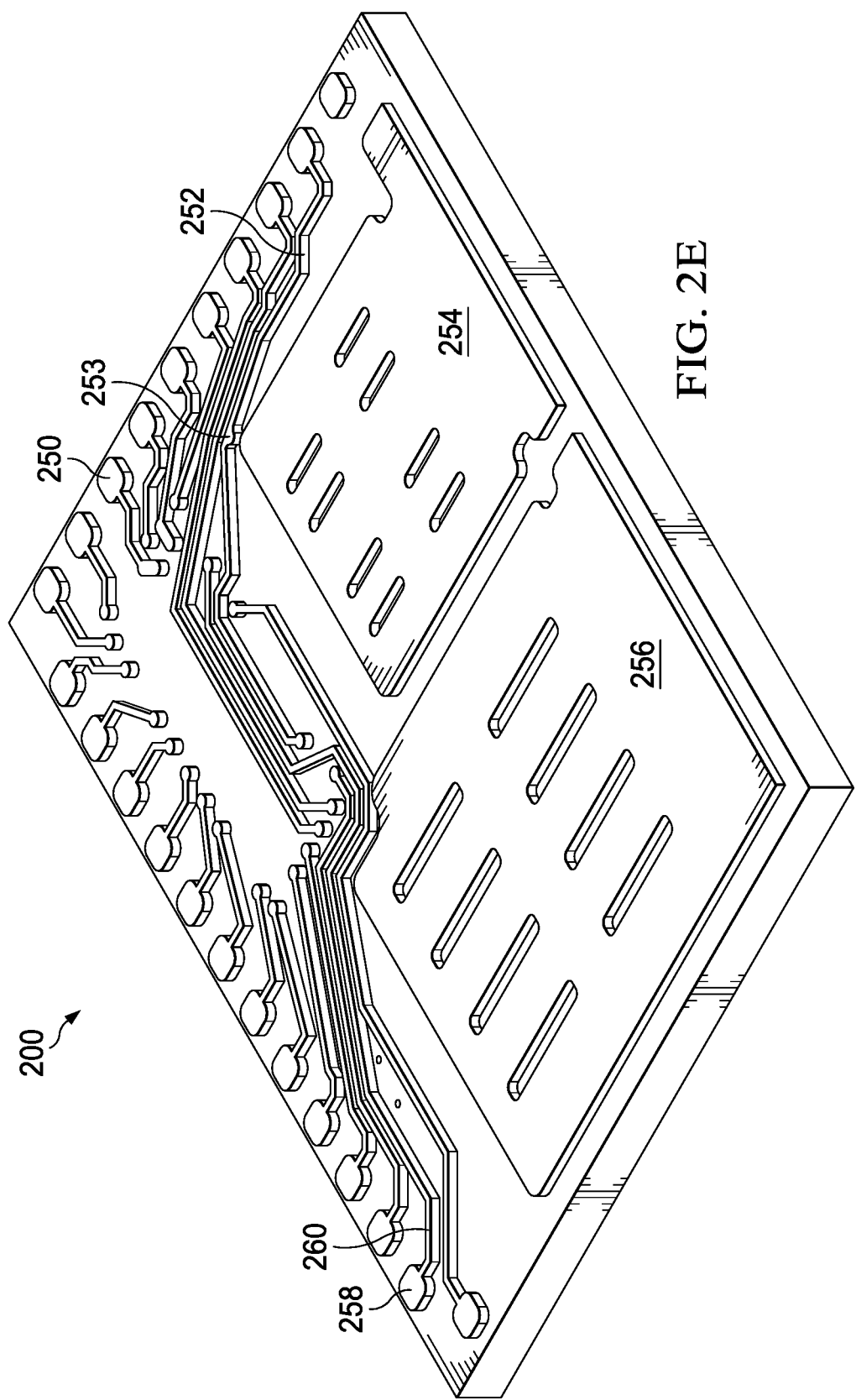

FIG. 2E depicts the example of FIG. 2D, but with the addition of a redistribution layer (RDL). In some examples, the RDL comprises a power supply connection 254, a ground connection 256, a plurality of traces (e.g., traces 252, 260), and a plurality of pillar pads (e.g., pillar pads 250, 253, 258). Each component of the RDL is conductive. The power supply connection 254 couples to the bond pads 242 and to the pillars 224 (FIG. 2D). The power supply connection 254 may have slots formed therein for any suitable purpose, e.g., to increase the surface area of the power supply connection 254, thereby enhancing heat dissipation, for stress release, to increase copper-to-Ajinomoto® buildup film (ABF) adhesion, etc. The ground connection 256 couples to the bond pads 240 and to the pillars 222 (FIG. 2D). The ground connection 256 may have slots formed therein for any suitable purpose, e.g., to increase the surface area of the ground connection 256, thereby enhancing heat dissipation, for stress release, to increase copper-to-ABF adhesion, etc. The pillar pad 253 couples to the bond pad 221, which connects to the gate of the high-side FET 232. The trace 252 couples the bond pad 221 to a bond pad of the controller 234 via which the controller 234 controls the gate of the high-side FET 232. The pillar pad 258 provides the trace 260 with electrical access to the gate of the low-side FET 230, which is located underneath the low-side FET 230, as explained above. The trace 260 couples to a bond pad of the controller 234 via which the controller 234 controls the gate of the low-side FET 230.

Figure 2F:
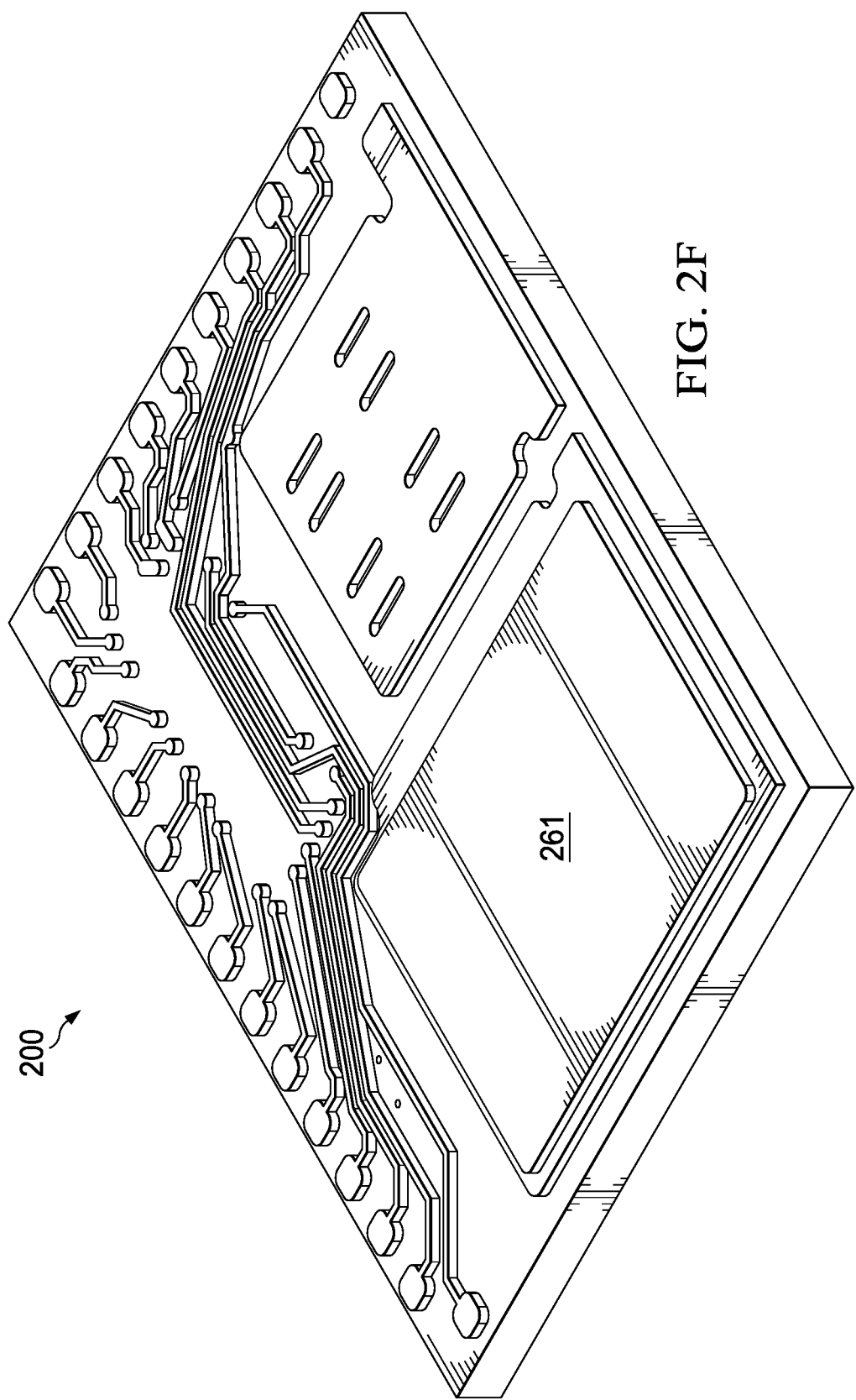

FIG. 2F depicts the example of FIG. 2E, but with the addition of a heat sink 261 coupled to a top surface of the low-side FET 230. In some examples, the heat sink 261 is formed using the same or similar photolithography process as is used for pillars and is composed of copper or any other suitable metal or alloy. In some examples, the heat sink 261 is formed separately and coupled to the low-side FET 230. In some examples, the heat sink 261 is plated onto the low-side FET 230. The heat sink 261 may be shaped as desired to achieve a target surface area to enhance heat dissipation to the extent desired. In some examples, additional heat sinks may be included, for example on the high-side FET 232.

Figure 2G:
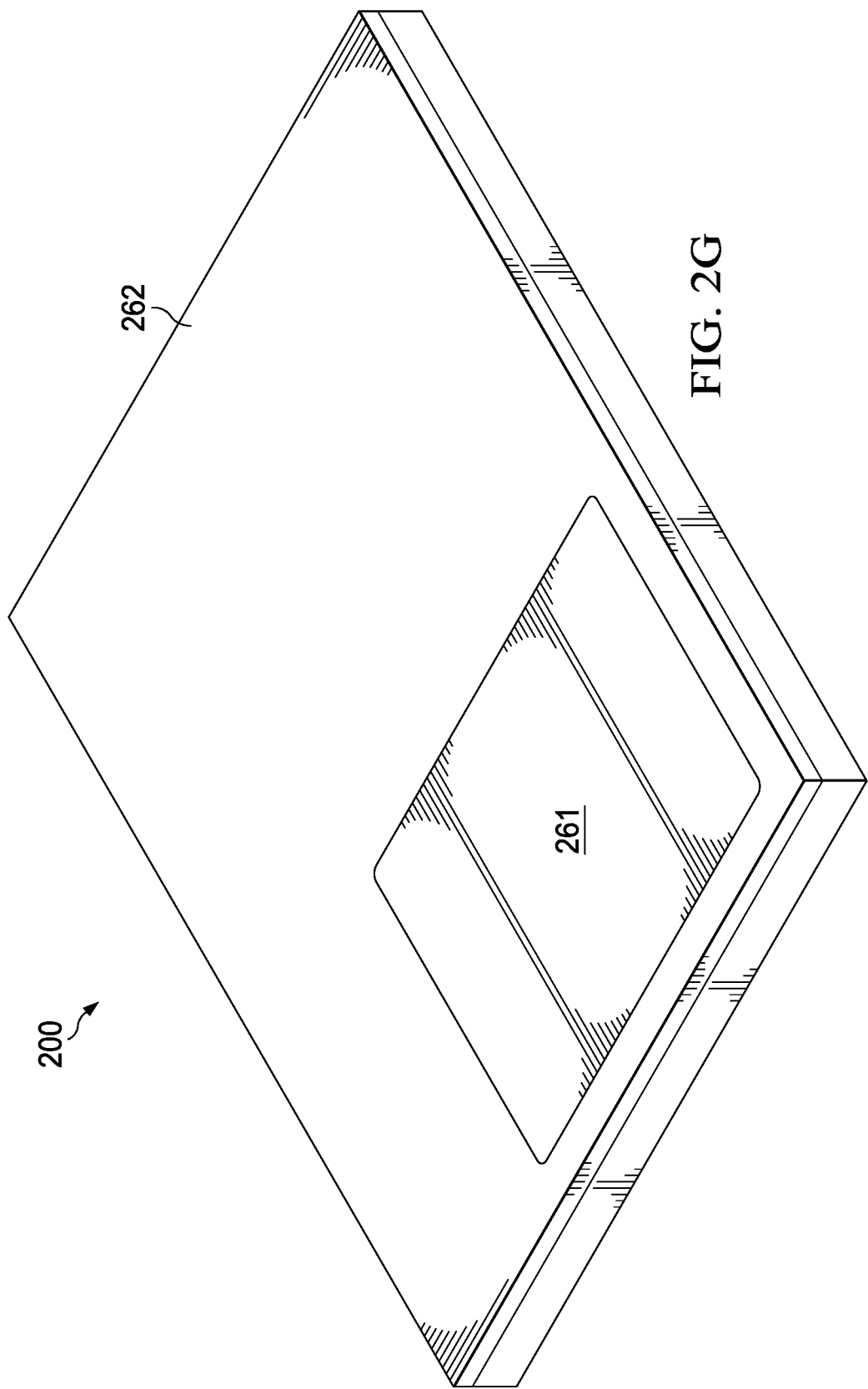

FIG. 2G depicts the example of FIG. 2F, but with the addition of a mold compound 262 (e.g., epoxy) to encapsulate the structure of FIG. 2G. The mold compound 262 is ground down to expose a top surface of the heat sink 261, as shown. If additional heat sinks are included, the top surfaces of such heat sinks may be exposed as is the case with the heat sink 261.

Figure 3A:
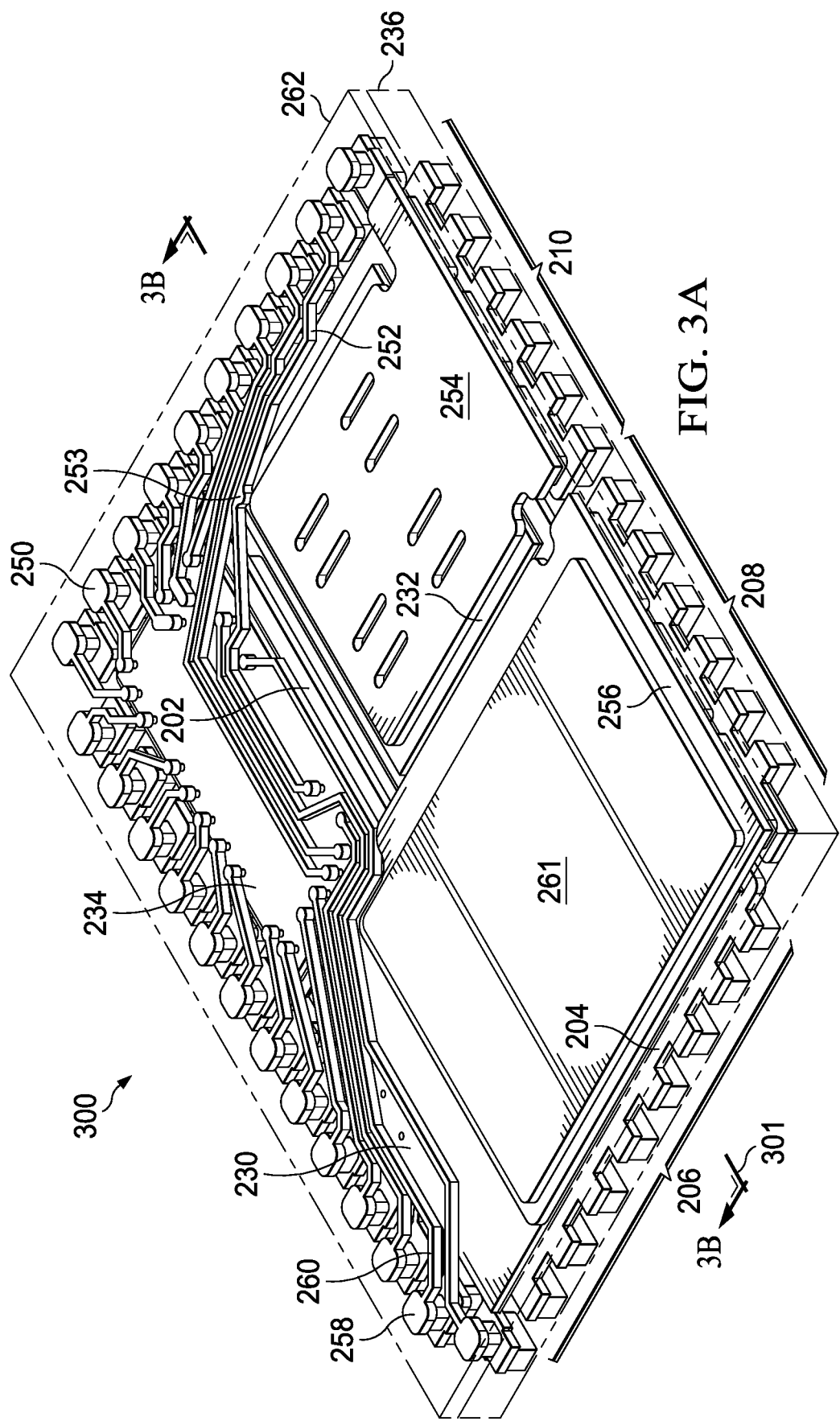
FIGS. 3A and 3B depict perspective and cross-sectional views, respectively, of a semiconductor device using a side-by-side die configuration, in accordance with various examples.

FIG. 3A is a perspective view of the completed structure of FIG. 2G, with the mold compounds 236, 262 made to appear transparent so that the contents of the structure are more readily visible. In summary, the package 300 comprises the controller 234 coupled to the controller pad 202; the low-side FET 230 coupled to the conductive member 204; and the high-side FET 232 coupled to the conductive member 204. The conductive terminals 206 couple (and may be formed as part of) to the conductive member 204. The power supply connection 254 couples to the high-side FET 232 (e.g., to the drain of the high-side FET 232). The power supply connection 254 also couples to the pillars formed on the conductive terminals 210. The ground connection 256 couples to the low-side FET 230 (e.g., to the source of the low-side FET 230). The ground connection 256 also couples to the pillars formed on the conductive terminals 208. The heat sink 261 couples to the top surface of the ground connection 256. The controller 234 couples to various components in the package 300 via the RDL. For example, the controller 234 couples to the gate of the high-side FET 232 via the pillar pad 253. Similarly, the controller 234 couples to the gate of the low-side FET 230 via the trace 260, the pillar pad 258, trace 216 (FIG. 2A), and bond pad 218 (FIG. 2A), where bond pad 218 couples to the gate on the underside of the low-side FET 230. The conductive member 204 serves as the switching node 116 (FIG. 1) coupled to the source of the high-side FET 232 and the drain of the low-side FET 230. In this manner, the package 300 of FIG. 3A implements the circuit diagram depicted in FIG. 1.

Figure 3B:
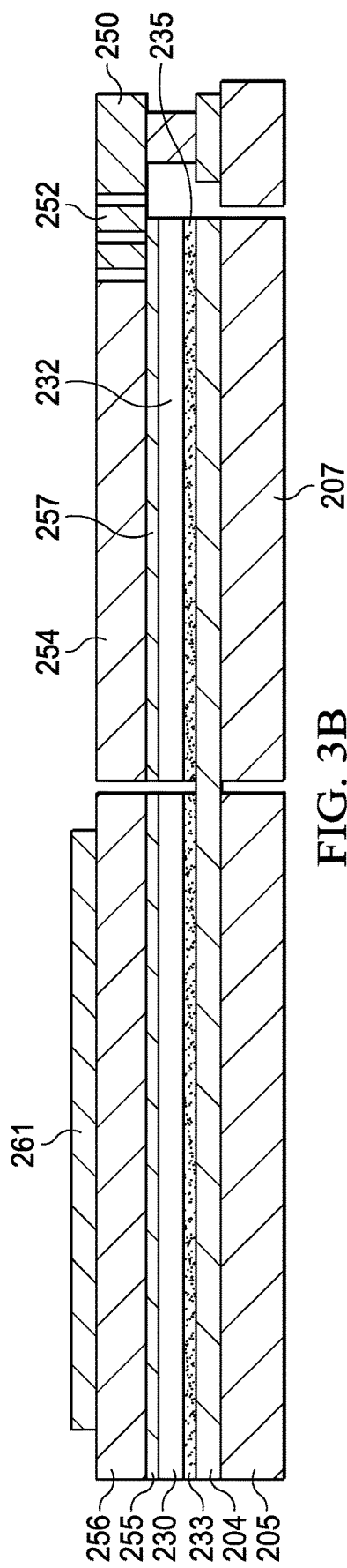

FIG. 3B depicts a cross-sectional view of the package 300, in accordance with various examples. The cross-section is taken along line 301 of FIG. 3A. As shown, solder layer 233 couples the low-side FET 230 to the conductive member 204, and the solder layer 235 couples the high-side FET 232 to the conductive member 204. FIG. 3B additionally depicts mounting layers 205 and 207, which in some examples comprise conductive layers used in conjunction with solder paste to couple the package to another electronic device, such as a printed circuit board (PCB). Power supply connection 254 and ground connection 256 couple to the FETs 232, 230 using, e.g., plating layers 257, 255 (as formed by a suitable plating process). The heat sink 261 couples to the ground connection 256. The trace 252 couples to a pillar pad 250. Because only two solder layers are used in this particular example due to the presence of non-overlapping (non-stacked) FETs, the number of failure points is reduced, thereby increasing the durability of the package 300 relative to packages that have a stacked configuration with additional solder layers.

In FIGS. 2A-2G and 3A-3B, the conductive member 204 is positioned below the FETs 230, 232, while the power supply connection 254 and the ground connection 256 are positioned on top of the FETs 230, 232. In some examples, this configuration is reversed so that the power supply connection 254 and the ground connection 256 are positioned below the FETs 230, 232, while the conductive member 204 is positioned on top of the FETs 230, 232. The manufacturing process flow is similar to that described above with respect to FIGS. 2A-2G, except with the appropriate modifications to the process flow so that the conductive member 204 is positioned on top of the FETs 230, 232 and so that the power supply and ground connections 254, 256 are positioned below the FETs 230, 232. FIG. 4A depicts the resulting package 400, which comprises a power supply connection 402, a ground connection 404, and a controller pad (not visible in this view). A low-side FET 416 is coupled to the ground connection 404, while a high-side FET 418 is coupled to the power supply connection 402. Conductive terminals 408 couple to (or are formed as part of) the power supply connection 402. Conductive terminals 406 couple to (or are formed as part of) the ground connection 404.

A controller 420 is mounted on the controller pad. Traces 424 and pillar pads 426 facilitate connections between the controller 420 and various parts of the package 400, for example, the gates of the FETs 416, 418 (e.g., gates on the top or bottom surfaces of the FETs 416, 418, as is the case for the FETs described above with respect to FIGS. 2A-2G and 3A-3B). Additional conductive terminals 410, 412 facilitate connections between the controller 420 and circuitry outside the package 400 and/or below the FETs 416, 418 (e.g., gate connections located on the bottom surfaces of the FETs 416, 418). A conductive member 422 is coupled to the top surfaces of the FETs 416, 418. Although the drains and sources of the FETs 416, 418 may be oriented in any desired manner, in some examples, the source of the high-side FET 418 couples to the conductive member 422, and the drain of the low-side FET 416 couples to the conductive member 422, while the drain of the high-side FET 418 couples to the power supply connection 402, and the source of the low-side FET 416 couples to the ground connection 404. The conductive member 422 couples to, or has formed as a part thereof, the conductive terminals 414. In some examples, slots may be formed in the conductive member 422, for instance, to increase heat dissipation from the conductive member 422. In some examples, one or more heat sinks may be coupled to a top side of the conductive member 422.

Figure 4B:
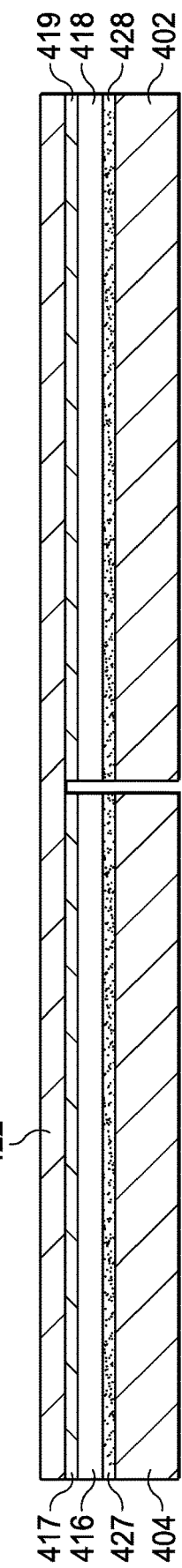
FIGS. 4A and 4B depict perspective and cross-sectional views, respectively, of a semiconductor device using a side-by-side die configuration, in accordance with various examples.
Figure 4A:
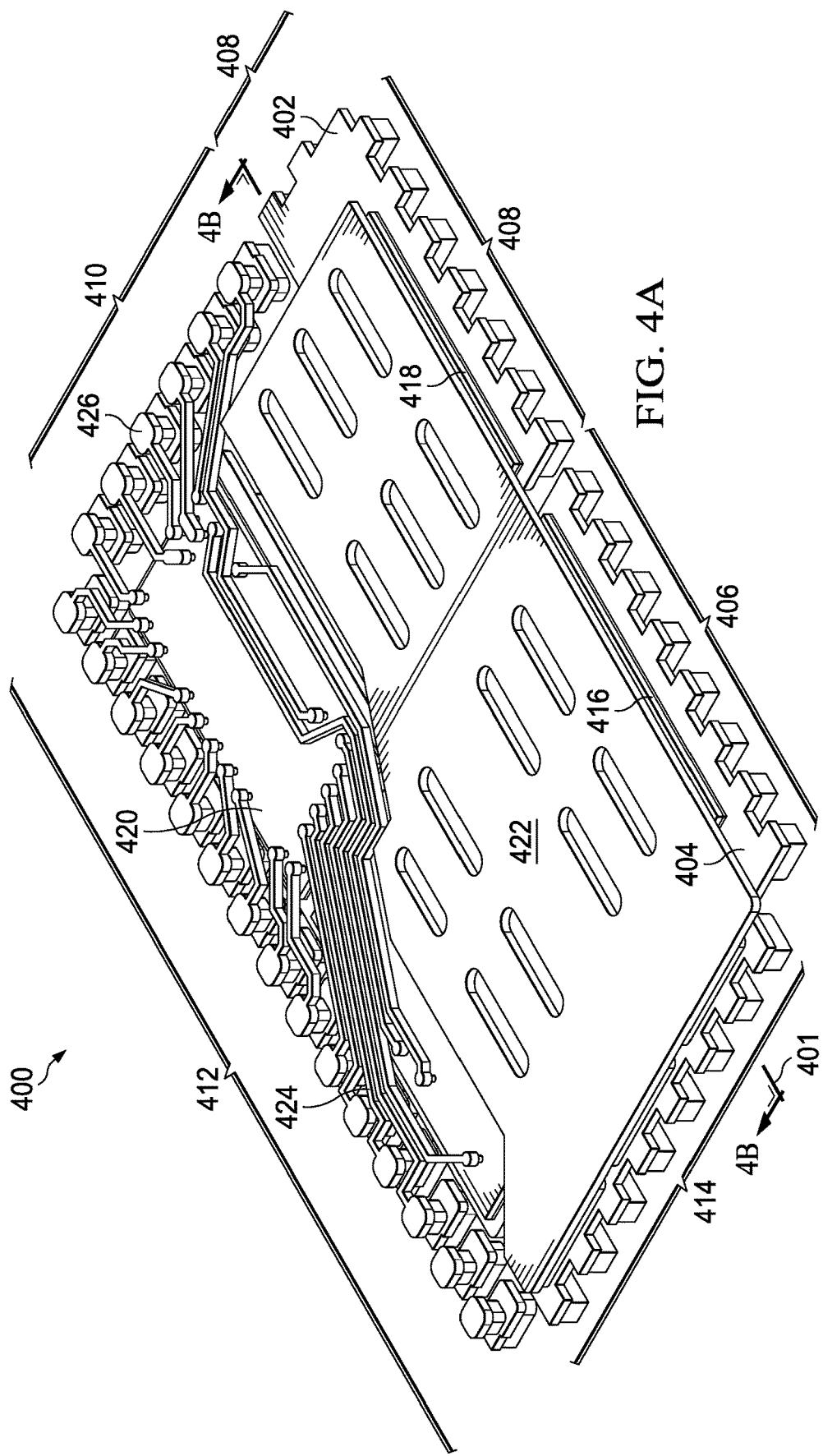

FIG. 4B depicts a cross-sectional view of the package 400 along line 401 (FIG. 4A). A solder layer 427 couples the low-side FET 416 to the ground connection 404, and a solder layer 428 couples the high-side FET 418 to the power supply connection 402. Plating layers 417, 419 may be used to couple the conductive member 422 to the FETs 416, 418, for example, as formed using any suitable plating process.

The foregoing examples may be produced using any suitable specifications as desired. In some examples, however, the drain-source on resistances (RDSon) for the power supply connection, the ground connection, and the switching node are approximately 0.0016, 0.0007, and 0.08 milli-Ohms, respectively. In some examples, the thermal resistances are approximately 25.13 degrees Celsius per Watt and 5.18 degrees Celsius per Watt. In some examples, the package is between approximately 0.325-0.425 mm thick. In some examples, the leadframe (e.g., any pads, conductive terminals, etc.) has a thickness ranging between approximately 40-60 micrometers. In some examples, the solder layers are approximately 20-30 micrometers thick. In some examples, the FETs are approximately 40-60 micrometers thick. In some examples, the controller is approximately 40-60 micrometers thick. In some examples, the pillars are approximately 100-130 micrometers thick. In some examples, the RDL layer is approximately 50-70 micrometers thick.

Figure 5A:
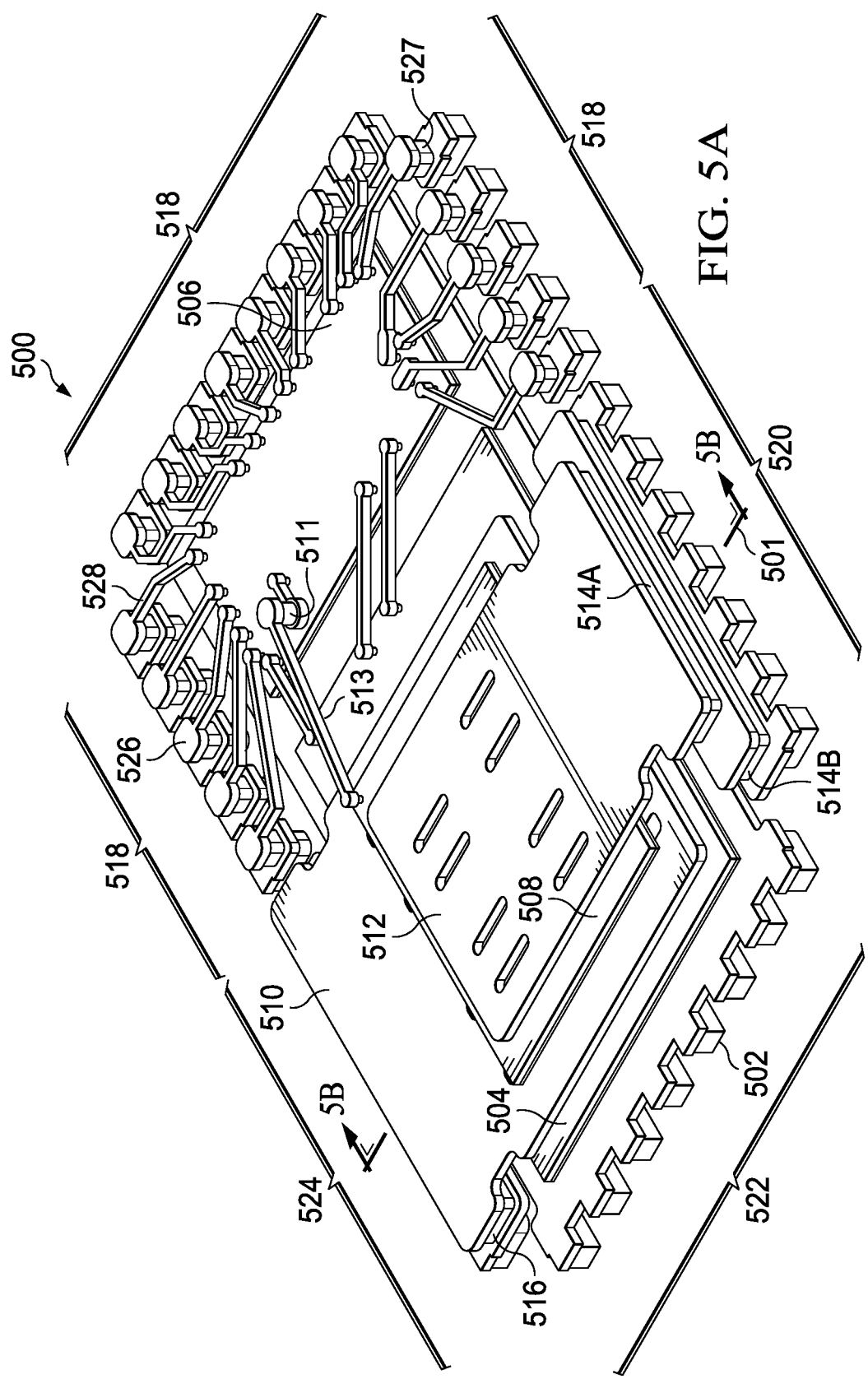

FIG. 5A depicts a perspective view of a semiconductor device 500 using a stacked die configuration, in accordance with various examples. The device 500 comprises a ground connection 502, a low-side FET 504, a high-side FET 508, a conductive member 510 (which may serve as a switching node), and a power supply connection 512. These components together form the circuit of FIG. 1. A controller 506 controls the FETs 504, 508, among other functions. The controller 506 couples to the high-side FET 508 by way of pillar 511 and trace 513. The pillar 511 elevates the trace 513 to a horizontal plane suitable for coupling to a top surface of the high-side FET 508, as shown. The controller 506 couples to other pillars 527 by way of traces 528 and pillar pads 526, and to the low-side FET 504 by way of traces 528. The semiconductor device 500 may include a plurality of conductive terminals 518, 520, 522, and 524. The controller 506 couples to the conductive terminals 518 using traces 528 to enable the controller 506 to communicate with electronic devices outside the semiconductor device 500. The conductive terminals 520 couple to the power supply connection 512 via multiple pillars (e.g., copper pillars) 514A, 514B. The use of such pillars 514A, 514B mitigates the use of clips, which are used in traditional stacked die configurations. As a result, solder layers that would otherwise have been used with clips are omitted. The pillars 514A, 514B may be formed using any suitable technique, for example a plating process, as described below.

Still referring to FIG. 5A, the conductive member 510 couples to the conductive terminals 524 by way of a pillar 516. The pillar 516, like the pillars 514A, 514B, may be formed using a plating process, for example. In examples, the conductive terminals 522 are part of the ground connection 502. As described with respect to FIG. 5B below, the FETs 508, 504 couple to the conductive member 510 and the ground connection 502, respectively, using solder layers. The remaining connections in the semiconductor device 500 are formed using non-solder materials. For example, the FETs 508, 504 may couple to the voltage supply connection 512 and the conductive member 510, respectively, using plated layers.

FIG. 5B depicts a cross-sectional view of the semiconductor device 500 along line 501 (FIG. 5A), in accordance with various examples. As shown, the device 500 includes the ground connection 502, on top of which is positioned a solder layer 536, on top of which is positioned the low-side FET 504. A plating process is performed to produce a plated layer 532, on top of which is positioned the conductive member 510, on top of which is positioned a solder layer 534. The high-side FET 508 is positioned on top of the solder layer 534, on top of which is positioned a plated layer 530, on top of which is positioned the voltage supply connection 512. The voltage supply connection 512 couples to the conductive terminal 520 via a pair of pillars 514A, 514B (formed, e.g., using a plating process), and the conductive member 510 couples to the conductive terminal 524 via a pillar 516 (formed, e.g., using a plating process).

FIG. 6 depicts a cross-sectional view of a semiconductor device 600 using a stacked die configuration, in accordance with various examples. The device 600 is an MIS package, for example. The structure of the device 600 is an alternative example and thus differs in some respects from that of the device 500, but the stacked die configuration is nevertheless used. The device 600 comprises a ground connection 602, a low-side FET 604, a high-side FET 608, a conductive member 610, and a power supply connection 612. These components implement the circuit of FIG. 1. The device 600 further comprises a controller 606 that couples to the low-side FET 604 via a conductive member 628 and to the high-side FET 608 via a pillar 611, conductive members 613, 640, and a plating layer 641. The conductive member 610 couples to a conductive terminal 624 via a pillar 616. The power supply connection 612 couples to a conductive terminal 620 via a pair of pillars 614A, 614B and a conductive member 642 positioned therebetween. A plating layer 630 couples the high-side FET 608 to the power supply connection 612. Similarly, a plating layer 632 couples the low-side FET 604 to the conductive member 610. The controller 606 couples to a conductive terminal 618 via a conductive member 629 and a pillar 627. The controller 606 is positioned on the ground connection 602 via a solder layer 638. Similarly, the high-side FET 608 couples to the conductive member 610 via a solder layer 634, and the low-side FET 604 couples to the ground connection 602 via a solder layer 636. Multiple mold compound layers 644, 646, 648 may be used to cover the electrical components of the semiconductor device 600, as shown, although the scope of this disclosure is not limited to any particular number, thickness, or type of mold compound layers. Pre-mold layers 650 may be included as shown.

In some examples, the ground connection 602 has a thickness of approximately 100 micrometers. In some examples, each of the solder layers 634, 636, 638 has a thickness of approximately 25 micrometers. In some examples, each of the pillars of FIG. 6 has a thickness of approximately 115 micrometers. In some examples, each of the FETs 604, 608 and the controller 606 has a thickness of approximately 50 micrometers. In some examples, each of the conductive members in FIG. 6 and the power supply connection 612 has an approximate thickness of 60 micrometers. Such thicknesses are merely illustrative and can vary between, e.g., 10 micrometers and 300 micrometers.

Figure 7E:
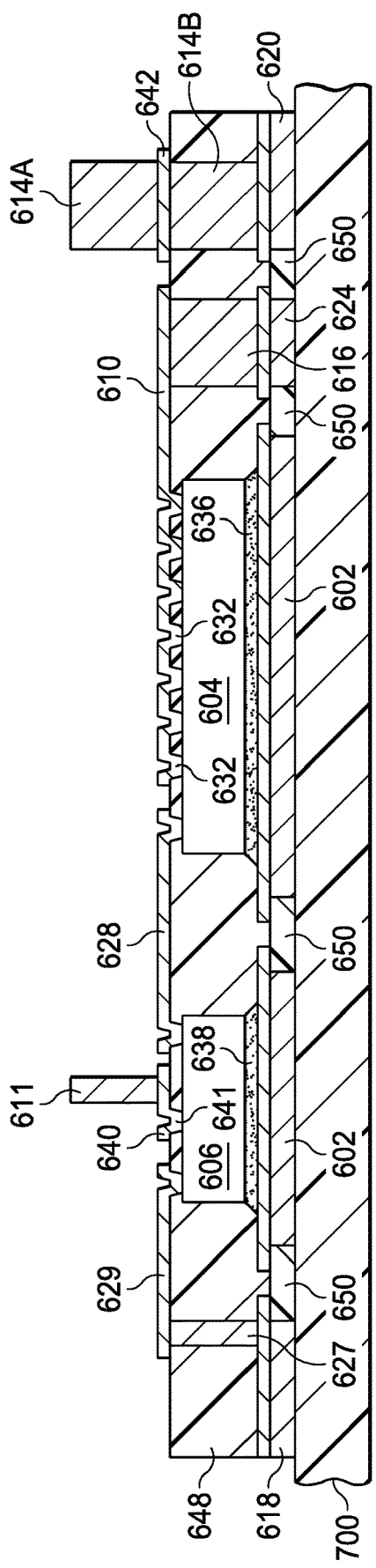
Figure 7F:
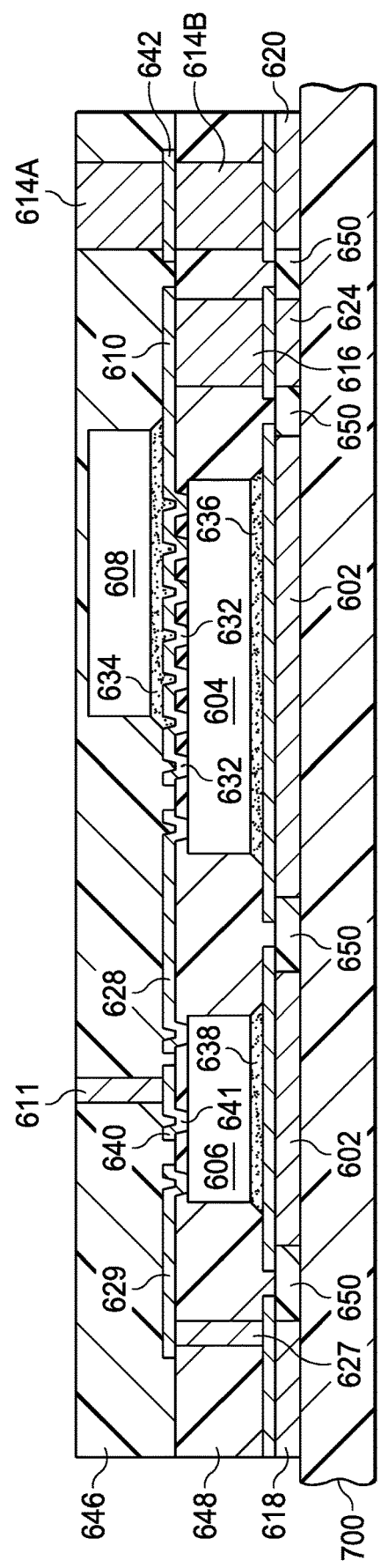
Figure 7G:
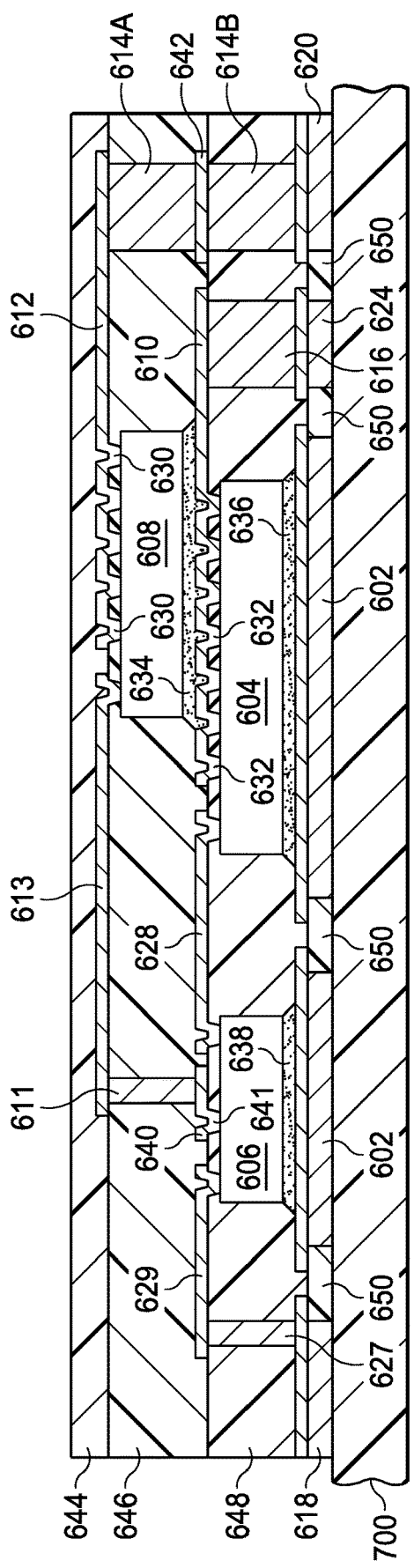
Figure 7H:
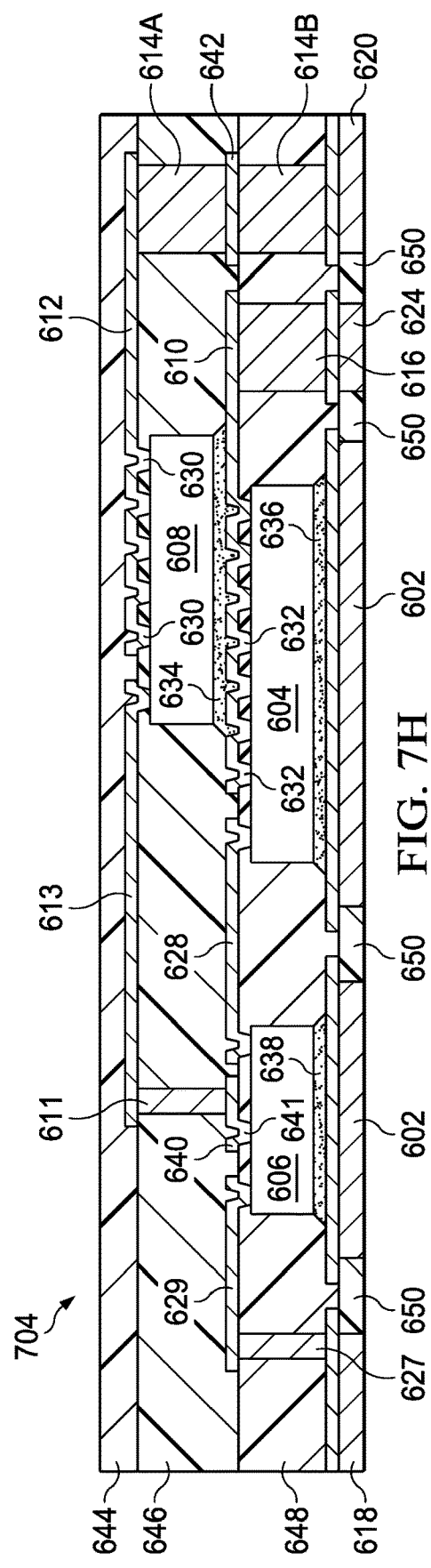

FIGS. 7A-7H depict a process flow diagram for assembling the structure of FIG. 6. The process begins in FIG. 7A, in which a carrier 700 supports the ground connection 602, the pre-mold layers 650, the conductive terminals 618, 620, 624, and the pillars 614B, 616, 627. In FIG. 7B, the controller 606 and low-side FET 604 are soldered to the ground connection 602. The mold compound layer 648 is applied. In FIG. 7C, a grinding process is performed to thin the mold compound layer 648. In FIG. 7D, a drilling process (e.g., using a laser drill) is performed to create orifices 702 in the mold compound layer 648, as shown. In FIG. 7E, a plating process is performed to form the pillars 611, 614A, the conductive members 610, 628, 629, 640, and the plating layers 632, 641. In FIG. 7F, the high-side FET 608 is soldered to the conductive member 610, and the mold compound layer 646 is applied. In FIG. 7G, a drilling and plating process is again performed to form the power supply connection 612 and conductive member 613, along with the plating layer 630. The mold compound layer 644 is applied. In FIG. 7H, the carrier 700 is etched away, producing the package 704 (e.g., an MIS package).

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications. Unless otherwise stated, "about," "approximately," or "substantially" preceding a value means +/−10 percent of the stated value.

What is claimed is:

1. A semiconductor device, comprising:
    a conductive member including a surface;
    a power supply connection;
    a ground connection;
    a first field effect transistor (FET) including a first surface and a second surface opposite the first surface, wherein:
        a first solder layer disposed on the first surface of the first FET abuts the surface of the conductive member; and
        a first plating layer disposed on the second surface of the first FET abuts the power supply connection; and
    a second FET having a third surface and a fourth surface opposite the third surface, wherein:
        a second solder layer disposed on the third surface of the second FET abuts the surface of the conductive member; and
        a second plating layer disposed on the fourth surface of the second FET abuts the ground connection, wherein the first and second FETs occupy first and second portions of the surface of the conductive member, respectively, the first and second portions not overlapping with each other.

2. The semiconductor device of claim 1, further comprising:
    a controller coupled to the first FET and to the second FET.

3. The semiconductor device of claim 2, further comprising:
    a plurality of pillars coupling the controller to the first FET and to the second FET.

4. The semiconductor device of claim 3, wherein individual pillars of the plurality include copper protrusion on corresponding conductive terminals.

5. The semiconductor device of claim 2, further comprising:
    a plurality of traces coupling the controller to the first FET and to the second FET.

6. The semiconductor device of claim 2, further comprising:
    a plurality of pillar pads coupling the controller to the first FET and to the second FET.

7. The semiconductor device of claim 2, further comprising:
    a first pillar pad coupled to a gate of the first FET, wherein the gate of the first FET faces away from the conductive member;
    a second pillar pad coupled to a node of the controller; and
    a trace coupling the first pillar pad to the second pillar pad.

8. The semiconductor device of claim 7, wherein the trace is connected to a third pillar pad coupled to a conductive terminal.

9. The semiconductor device of claim 2, further comprising:
a pillar pad coupled to a gate of the second FET, wherein the gate of the second FET faces toward the conductive member;
a bond pad of the controller; and
a trace coupling the pillar pad to the bond pad of the controller.

10. The semiconductor device of claim 1, wherein the power supply connection is coplanar with the ground connection.

11. The semiconductor device of claim 1, wherein the semiconductor device is exclusive of a bond wire.

12. The semiconductor device of claim 1, wherein the conductive member corresponds to a switching node of the semiconductor device.

13. A semiconductor device, comprising:
a first field effect transistor (FET) including a first surface and a second surface opposite the first surface;
a first solder layer disposed on the first surface of the first FET;
a first plating layer disposed on the second surface of the first FET;
a conductive member abutted to the first plating layer at a first side of the conductive member;
a second solder layer disposed on a second side of the conductive member opposite the first side of the conductive member;
a second FET including a first surface and a second surface opposite the first surface, the second solder layer abutted to the first surface of the second FET; and
a second plating layer disposed on the second surface of the second FET.

14. The semiconductor device of claim 13, further comprising:
a controller coupled to the first and second FETs.

15. The semiconductor device of claim 14, wherein:
the controller includes a first node coupled to a gate of the first FET; and
the controller includes a second node coupled to a gate of the second FET.

16. The semiconductor device of claim 15, wherein the first node of the controller is coupled to the gate of the first FET through a trace.

17. The semiconductor device of claim 15, wherein the second node of the controller is coupled to the gate of the second FET through a pillar and a trace.

18. The semiconductor device of claim 15, wherein the conductive member is a first conductive member, and wherein the first node of the controller is coupled to the gate of the first FET through a second conductive member.

19. The semiconductor device of claim 15, wherein the conductive member is a first conductive member, and wherein the second node of the controller is coupled to the gate of the second FET through a pillar, second and third conductive members, and a plating layer.

20. The semiconductor device of claim 14, wherein the controller is coupled to a conductive terminal through a pillar.

21. The semiconductor device of claim 13, wherein:
the first FET has a gate that faces away from the first solder layer; and
the second FET has a gate that faces away from the first solder layer.

22. The semiconductor device of claim 13, wherein the conductive member is coupled to a conductive terminal through a pillar.

23. The semiconductor device of claim 13, further comprising:
a ground connection coupled to the first solder layer.

24. The semiconductor device of claim 13, further comprising:
a power supply connection coupled to the second plating layer, the power supply connection coupled to a conductive terminal via first and second pillars.

25. The semiconductor device of claim 24, wherein the conductive member is a first conductive member, and the semiconductor device further comprising:
a second conductive member disposed between the first and second pillars.

26. The semiconductor device of claim 13, wherein the semiconductor device is exclusive of a bond wire.

27. The semiconductor device of claim 13, wherein the conductive member corresponds to a switching node of the semiconductor device.

* * * * *